United States Patent
Khor et al.

(10) Patent No.: US 12,555,705 B2
(45) Date of Patent: Feb. 17, 2026

(54) THIN FILM RESISTOR WITH VIABAR STRUCTURE

(71) Applicant: GlobalFoundries Singapore Pte. Ltd., Singapore (SG)

(72) Inventors: Eejan Khor, Singapore (SG); Wanbing Yi, Singapore (SG); Qiying Wong, Singapore (SG); Feifei He, Singapore (SG)

(73) Assignee: GLOBALFOUNDRIES SINGAPORE PTE LTD, Singapore (SG)

( * ) Notice: Subject to any disclaimer, the term of this patent is extended or adjusted under 35 U.S.C. 154(b) by 0 days.

(21) Appl. No.: 18/772,320

(22) Filed: Jul. 15, 2024

(65) Prior Publication Data
US 2026/0018320 A1 Jan. 15, 2026

(51) Int. Cl.
*H01C 17/075* (2006.01)
*H01C 1/084* (2006.01)
*H01C 7/00* (2006.01)

(52) U.S. Cl.
CPC ............ *H01C 7/006* (2013.01); *H01C 1/084* (2013.01); *H01C 17/075* (2013.01)

(58) Field of Classification Search
CPC ...... H01C 7/006; H01C 1/084; H01C 17/075; H01C 17/288; H01L 28/20; H01L 23/5228; H01L 21/76877; H01L 23/528
See application file for complete search history.

(56) References Cited

U.S. PATENT DOCUMENTS

| | | | |
|---|---|---|---|
| 6,703,666 B1 * | 3/2004 | Huttemann | H01C 17/08 257/E27.047 |
| 8,692,356 B2 | 4/2014 | Dirnecker et al. | |
| 8,754,741 B2 | 6/2014 | Williams et al. | |
| 8,803,287 B2 | 8/2014 | Dirnecker et al. | |
| 11,545,486 B2 | 1/2023 | Feng et al. | |
| 11,637,100 B2 | 4/2023 | Wong et al. | |
| 2012/0280360 A1 | 11/2012 | Dirnecker et al. | |
| 2012/0292741 A1 | 11/2012 | Dalton et al. | |
| 2013/0341759 A1 | 12/2013 | Khan et al. | |
| 2014/0184381 A1 | 7/2014 | Hao et al. | |

(Continued)

FOREIGN PATENT DOCUMENTS

JP 2003017301 1/2017

OTHER PUBLICATIONS

European Search Report dated Jun. 25, 2025 for EP Application 25151125.9; pp. 20.

*Primary Examiner* — Suberr L Chi
(74) *Attorney, Agent, or Firm* — Erica Ee; Hoffman Warnick LLC

(57) ABSTRACT

A thin-film resistor (TFR) includes conductive line(s) and a resistive layer over the conductive line(s). The TFR also includes at least one viabar structure coupled to the resistive layer and including a first viabar portion electrically connected to the resistive layer at an edge thereof and a second viabar portion electrically connected to the conductive line (s). In other cases, a viabar structures partially land over the resistive layer and are electrically connected to an edge of the resistive layer and partially land on the conductive line(s). Among other advantages, the viabar structure reduces current crowding from tight contact spacing, and allows alternative routing of interconnects to the TFR.

18 Claims, 4 Drawing Sheets

(56) References Cited

U.S. PATENT DOCUMENTS

| | | | |
|---|---|---|---|
| 2015/0069514 A1* | 3/2015 | Shih | H01L 21/47635 |
| | | | 257/350 |
| 2015/0187632 A1 | 7/2015 | Ali et al. | |
| 2022/0208675 A1 | 6/2022 | Gan et al. | |
| 2023/0197606 A1* | 6/2023 | Li | H01L 23/5226 |
| | | | 257/536 |

* cited by examiner

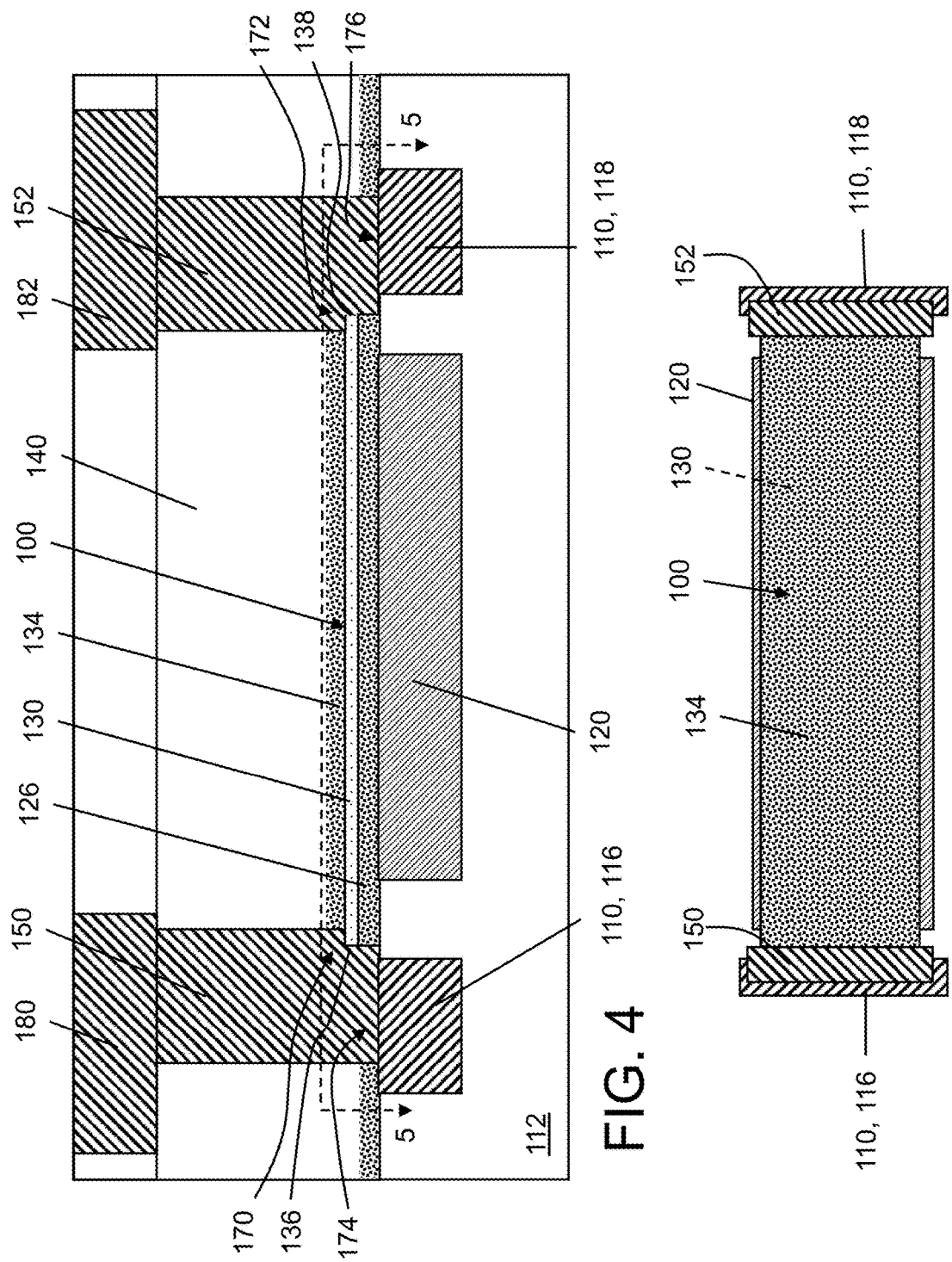

THIN FILM RESISTOR WITH VIABAR STRUCTURE

BACKGROUND

The present disclosure relates to integrated circuits and, more particularly, to a thin film resistor including a viabar structure.

Thin film resistors are used in integrated circuits. A thin film resistor includes a very thin resistive layer, e.g., 2-5 nanometers, with a plurality of contacts landing on opposing ends of the resistive layer. The contacts are vertical, cylindrical conductive posts that provide electrical connections to the thin film resistor. One challenge with thin film resistors is maintaining sheet resistance uniformity where formation of openings for the contacts punch through the resistive layer. Another challenge is limiting the effects of current crowding created by the close contact-to-contact spacing at the opposing ends on the resistive layer. Current thin film resistors also use metal layer interconnections from layers thereover, which limits routing options.

SUMMARY

All aspects, examples and features mentioned below can be combined in any technically possible way.

An aspect of the disclosure provides a thin-film resistor (TFR), comprising: a first conductive line; a resistive layer over the first conductive line; and at least one viabar structure coupled to the resistive layer and including a first viabar portion electrically connected to the resistive layer at an edge thereof and a second viabar portion electrically connected to the first conductive line.

An aspect of the disclosure provides a thin-film resistor (TFR), comprising: a first conductive line and a second conductive line; a resistive layer over the first conductive line and the second conductive line; a first viabar structure partially landed over the resistive layer and electrically connected to a first edge of the resistive layer and partially landed on the first conductive line; and a second viabar structure partially landed over the resistive layer and electrically connected to a second edge opposing the first edge of the resistive layer and partially landed on the second conductive line.

An aspect of the disclosure provides a method of forming a thin film resistor, the method comprising: forming a conductive line in a first dielectric layer; forming a resistive layer over the first dielectric layer; forming a second dielectric layer over the resistive layer; and forming viabar structures in the second dielectric layer including a first viabar structure partially landed over the resistive layer and electrically connected to a first edge of the resistive layer and partially landed on the conductive line, and a second viabar structure partially landed over the resistive layer and electrically connected to a second edge opposing the first edge of the resistive layer and partially landed on the conductive line.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein:

FIG. 4 show a cross-sectional view of a thin film resistor with a viabar structure, according to embodiments of the disclosure;

FIG. 5 shows a schematic cross-sectional view along view line 5-5 in FIG. 4;

Figure 1:
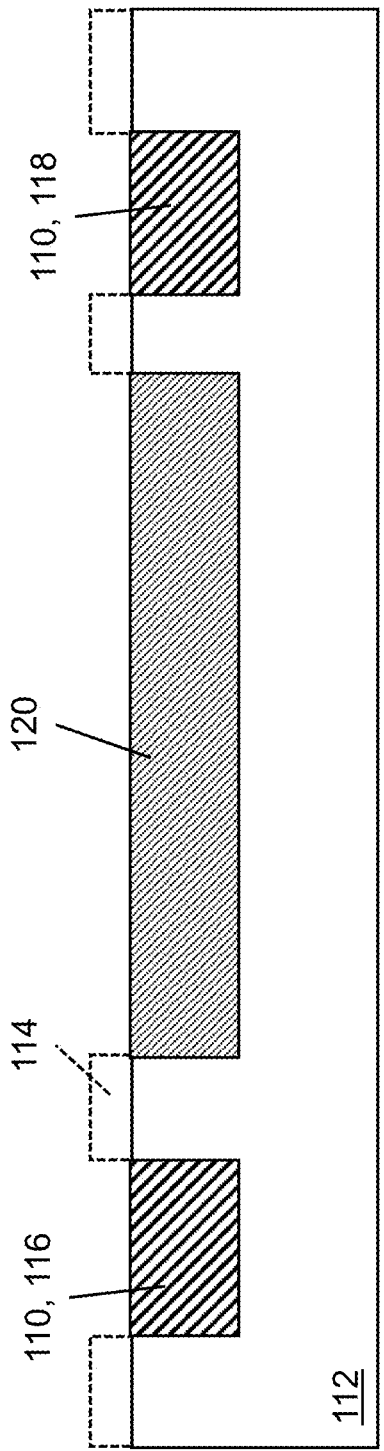
FIGS. 1-3 show cross-sectional views of a method of forming a thin film resistor with a viabar structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a thin-film resistor (TFR) including conductive line(s) and a resistive layer over the conductive line(s). The TFR also includes at least one viabar structure coupled to the resistive layer and including a first viabar portion electrically connected to the resistive layer at an edge thereof and a second viabar portion electrically connected to the conductive line(s). Viabar structures in this form can provide terminals on opposing edges of the resistive layer to provide the TFR. In other cases, viabar structures partially land over the resistive layer and electrically connect to a respective edge of the resistive layer and also partially land on the conductive line(s). Among other advantages, the viabar structures reduce current crowding from tight contact spacing typically experienced using conventional contacts, and allow alternative routing of interconnects to the TFR from below using the conductive line.

Figure 2:
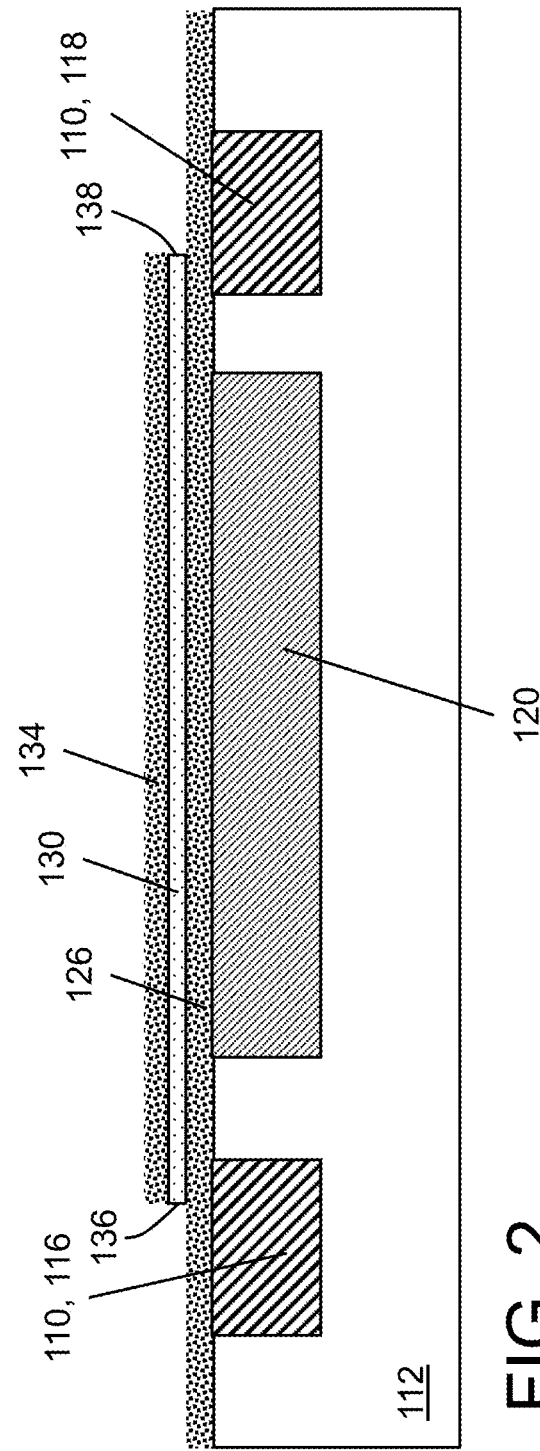
Figure 3:
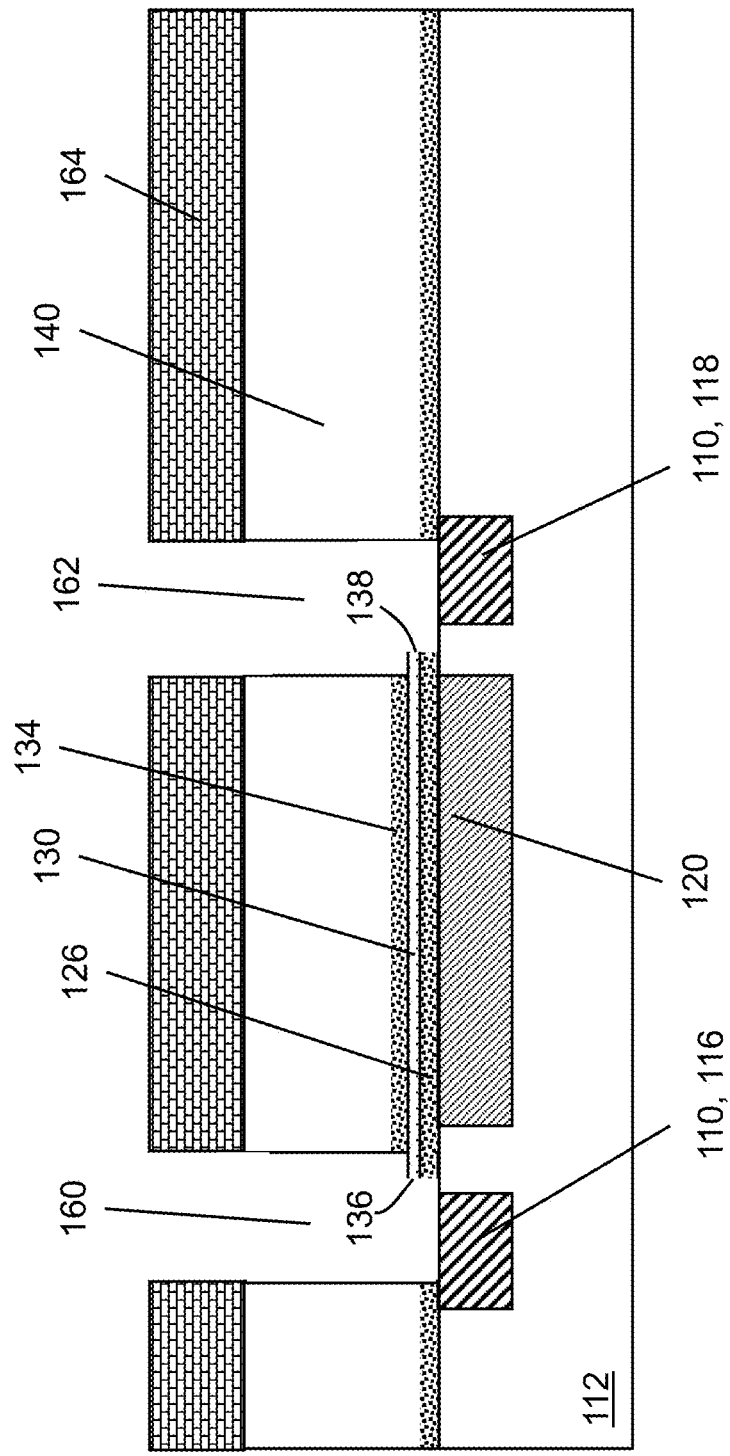

FIGS. 1-3 show cross-sectional views of a method of forming a thin film resistor (TFR) according to embodiments of the disclosure. FIG. 4 shows a cross-sectional view of a TFR 100, according to embodiments of the disclosure, and FIG. 5 shows a schematic cross-sectional view along view line 5-5 in FIG. 4.

FIG. 1 shows forming conductive line(s) 110 in a first dielectric layer 112. First dielectric layer 112 may include any now known interlayer dielectric material typically used in a middle-of-line (MOL) or back-end-of-line (BEOL) interconnect layer of an integrated circuit. A non-comprehensive list of ILD materials includes: silicon oxide; carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. First dielectric layer 112 may include one or more sub-layers and may be part of any interconnect layer in an integrated circuit, e.g., any MOL or BEOL interconnect layer. First dielectric layer 112 may be deposited using any appropriate deposition technique, for example, chemical vapor deposition, on a previously formed dielectric layer or semiconductor substrate. First dielectric layer 112 may have any desired thickness appropriate for the interconnect layer in which positioned.

Conductive line(s) 110 may be formed using any now known or later developed process for forming a conductor in dielectric material, e.g., a Damascene process. In one non-limiting example, conductive line(s) 110 may be formed by patterning a mask 114 (shown in dashed lines), etching openings to a desired depth, e.g., to an etch stop layer (not shown in FIG. 1) between dielectric layers, forming a conductor in the openings, removing mask 114 and planarizing to remove any excess conductor. The etching may use appropriate etching chemistry for the dielectric material used, e.g., a plasma-based etch such a reactive ion etch or other chemistry. As this process is otherwise well known in the semiconductor fabrication field, no further details are warranted for understanding. The conductor may include refractory metal liner, and a conductive metal. The refractory metal liner (not labeled for clarity) may include, for example, titanium nitride. The conductive metal may include any now known or later developed conductive metal used in integrated circuits such as but not limited to tungsten, copper, aluminum. Any desired silicide (not shown) may be formed on conductive line(s) 110 in a known fashion.

Conductive line(s) 110 may include two conductive lines 116 and 118, which do not contact one another. Conductive lines 116, 118, as will be described herein, provide a mechanism by which a viabar structure 150, 152 (FIGS. 4-5) can be formed as part of TFR 100 (FIGS. 4-5). Conductive lines 116, 118 may be electrically isolated from other conductive lines. In this case, conductive lines 116, 118 are electrically inoperative. In other embodiments, as will be described elsewhere herein, conductive lines 116, 118 may optionally be coupled to other conductive lines in, for example, first dielectric layer(s) 112 or other dielectric layers. Where conductive lines 116, 118 are electrically coupled to other conductive lines, they may be used to provide alternative electrical routing to operate TFR 100 (different than just interconnect layers above TFR 100 as is conventional). While two conductive lines 116, 118 are shown, it will be recognized that one of the conductive lines can be omitted in some embodiments.

FIG. 1 also shows optionally forming a heat sink 120 in first dielectric layer 112. Heat sink 120 will eventually be under a resistive layer 130 (FIGS. 4-5) of TFR 100 (FIGS. 4-5). Heat sink 120 may be formed using the same processes and at the same time as conductive line(s) 110. Heat sink 120 may also include the same materials as conductive line(s) 110. However, heat sink 120 may also be formed separately using similar processes as that for conductive line(s) 110 but with different materials. Heat sink 120 may have the same or different depth than conductive lines 116, 118. Heat sink 120 may include any thermally conductive material typically used in integrated circuits, e.g., a metal such as copper.

FIG. 2 shows forming a resistive layer 130 over first dielectric layer 112. More particularly, FIG. 2 shows forming a first etch stop layer (ESL) 126 over first dielectric layer 112, forming resistive layer 130 over first ESL 126, and forming a second ESL 134 over resistive layer 130. First and second ESL 126 and 134 may include any now known or later developed etch stop materials such as but not limited to silicon nitride or silicon oxynitride. First and second ESL 126, 134 may be deposited using any appropriate deposition technique for the material used, for example, chemical vapor deposition (CVD) for silicon nitride, and may have any desired thickness appropriate for the interconnect layer in which positioned. Resistive layer 130 may include any now known or later developed resistive material typically used for thin film resistors such as but not limited to silicon chromium, nickel chromium (Nichrome) and tantalum nitride. In certain cases, resistive layer 130 may have a thickness of 2-5 nanometers. In other cases, resistive layer 130 may have a thickness of 3-4 nanometers. (Note, layers 126, 130, 134 are shown having similar thicknesses for clarity within the drawings. It is emphasized that resistive layer 130 is typically significantly thinner than ESLs 126, 134.) Resistive layer 130 may be deposited using any appropriate technique, for example, atomic layer deposition.

First ESL 126 may be patterned in any now known or later developed manner prior to forming resistive layer 130 and second ESL 134 thereover, e.g., forming a mask thereover (not shown) an etching to remove first ESL 126 where exposed, e.g., using a reactive ion etch or other appropriate etching chemistry. However, in the drawings first ESL 126 is shown in a non-patterned state, i.e., it is over all of the structure shown. Resistive layer 130 and second ESL 134 may be patterned in a similar manner together, i.e., so second ESL 134 covers resistive layer 130. Resistive layer 130 and ESL(s) 126, 134 may have any desired lateral shape, i.e., into and out of page and/or across page of FIG. 2. In one non-limiting example, shown in FIG. 5, resistive layer 130 and ESL(s) 126, 134 have rectangular shapes. As understood in the art, the length of resistive layer 130 can be patterned to any desired dimensions to provide the desired resistance for TFR 100 (FIGS. 4-5). In particular, a length between electrodes or terminals, provided by viabar structures 150, 152 (FIGS. 4-5) herein, that electrically couple to resistive layer 130 determines, in part, the resistance provided by TFR 100 (FIGS. 4-5). As shown in FIG. 2, edges 136, 138 of resistive layer 130 are exposed after the patterning. Note, edges 136, 138 of resistive layer 130 may also be referenced as 'sidewalls' due to their location.

FIG. 3 shows forming a second dielectric layer 140 over resistive layer 130. More particularly, FIG. 3 shows forming a second dielectric layer 140 over second ESL 134 (and first dielectric layer 112). Second dielectric layer 140 may include any material listed herein for first dielectric layer 112 and may be formed in a similar manner. Second dielectric layer 140 may be deposited using any appropriate deposition technique, for example, CVD, and may have any desired thickness appropriate for the interconnect layer in which positioned. It may also include a number of sub-layers (not shown).

FIGS. 3 and 4 show forming viabar structures 150, 152 (FIGS. 4-5). As shown in FIG. 3, forming viabar structures 150, 152 includes forming viabar structure openings 160, 162 for each viabar structure 150, 152 in second dielectric layer 140. Viabar structure openings 160, 162 may be formed by patterning a mask 164 and etching openings 160, 162 to a desired depth, e.g., through second ESL 134 (and perhaps parts of resistive layer 130) to expose edges 136, 138 of resistive layer 130 and through first ESL 126 to expose conductive line(s) 110. Each viabar structure opening 160, 162 exposes a respective edge 136, 138 of resistive layer 130 and extends through first ESL 126 to expose conductive line(s) 110 in first dielectric layer 112. More particularly, mask 164 is configured to form viabar structure openings 160, 162 so they are partially over resistive layer 130 and partially over conductive line(s) 110. That is, one viabar structure opening 160 is over edge 136 of resistive layer 130 and over first conductive line 116 of conductive line(s) 110, and the other viabar structure opening 162 is over edge 138 of resistive layer 30 and over second conductive line 118 of conductive line(s) 110. As noted, edges 136, 138 of resistive layer 130 are exposed after viabar structure opening 160, 162 forming. The etching may use any appropriate etching chemistry for the dielectric material used (e.g., a plasma-based etch such a reactive ion etch or other chemistry) and may include a number of individual etch steps, e.g., a bottom anti-reflective coating (BARC) etch, an oxide etch and an nitride etch.

FIG. 4 shows the completion of forming viabar structures 150, 152 by forming a conductor in openings 160, 162 (FIG. 3), removing mask 164 (FIG. 3) and planarizing to remove any excess conductor. As this process is otherwise well known in the semiconductor fabrication field, no further details are warranted for understanding. The conductor may include refractory metal liner, and a conductive metal. The refractory metal liner (not labeled for clarity) may include, for example, titanium nitride. The conductive metal may include any now known or later developed conductive metal used in integrated circuits such as but not limited to tungsten, copper, aluminum. Any desired silicide (not shown) may be formed on viabar structures 150, 152. Conductor deposition in viabar structure openings 160, 162 (FIG. 3) causes a first viabar structure 150 to contact edge 136 of resistive layer 130, and a second viabar structure 152 to contact edge 138 of resistive layer 130, thus creating the two electrodes for TFR 100. In some cases, creating openings 160, 162 (FIG. 3) may also remove some of second ESL 134 over resistive layer 130. In this case, first viabar structure 150 may also contact an upper surface of resistive layer 130 adjacent edge 136, and second viabar structure 152 may also contact an upper surface of resistive layer 130 adjacent edge 138. However, this is not necessary in all cases. Note, while two viabar structures 150, 152 are shown, conventional contacts may be used on one end of TFR 100, if desired.

Referring to FIGS. 4 and 5, TFR 100 includes conductive line(s) 110, and resistive layer 130 over conductive line(s) 110, i.e., not directly over but above conductive line(s) 110. TFR 100 also includes at least one viabar structure 150, 152 coupled to resistive layer 130 and including a first viabar portion 170 or 172 electrically connected to resistive layer 130 at edge 136 or 138 thereof and a second viabar portion 174 or 176 electrically connected to conductive line(s) 110. Where viabar structures includes two viabar structures, first viabar structure 150 is on first edge 136 (i.e., contacting) of resistive layer 130 and second viabar structure 152 is on second edge 138 (i.e., contacting) of resistive layer 130. In other cases, TFR 100 may include first viabar structure 150 partially landed over resistive layer 130 and electrically connected to first edge 136 of resistive layer 130 and partially landed on conductive line(s) 110, i.e., conductive line 116 thereof. TFR 100 also includes second viabar structure 152 partially landed over resistive layer 130 and electrically connected to second edge 138 opposing first edge 136 of resistive layer 130 and partially landed on conductive line(s) 110, i.e., conductive line 118 thereof. First viabar structure 150 is coupled to resistive layer 130 and includes first viabar portion 170 thereof electrically connected to resistive layer 130 at edge 136, and second viabar structure 152 is coupled to resistive layer 130 and includes second viabar portion 172 thereof electrically connected to resistive layer 130 at edge 138. The viabar portions 170, 172 may include a respective vertical sidewall of a respective viabar structure 150, 152. Conductive line(s) 110 may include first conductive line 116 coupled to second viabar portion 174 of first viabar structure 150, and second conductive line 118 separate from first conductive line 116 coupled to second viabar portion 176 of second viabar structure 152.

TFR 100 may also include second ESL 134 over resistive layer 130 and first ESL 126 under resistive layer 130 and over conductive line(s) 110, i.e., above conductive lines 116, 118. Second viabar portions 174, 176 extend through first ESL 126 to couple to conductive line(s) 110. Conductive line(s) 110 is/are in first dielectric layer 112. TFR 100 may optionally include heat sink 120 in first dielectric layer 112 under resistive layer 130.

FIGS. 4 and 5 also show tertiary conductive lines 180, 182 coupled to viabar structures 150, 152 in dielectric layer(s) above second dielectric layer 140. Tertiary conductive lines 180, 182 may be formed similarly to conductive line(s) 110, and may be formed with or after viabar structures 150, 152. As understood in the art, tertiary conductive lines 180, 182 may be used to provide electrical routing to TFR 100.

Figure 6:
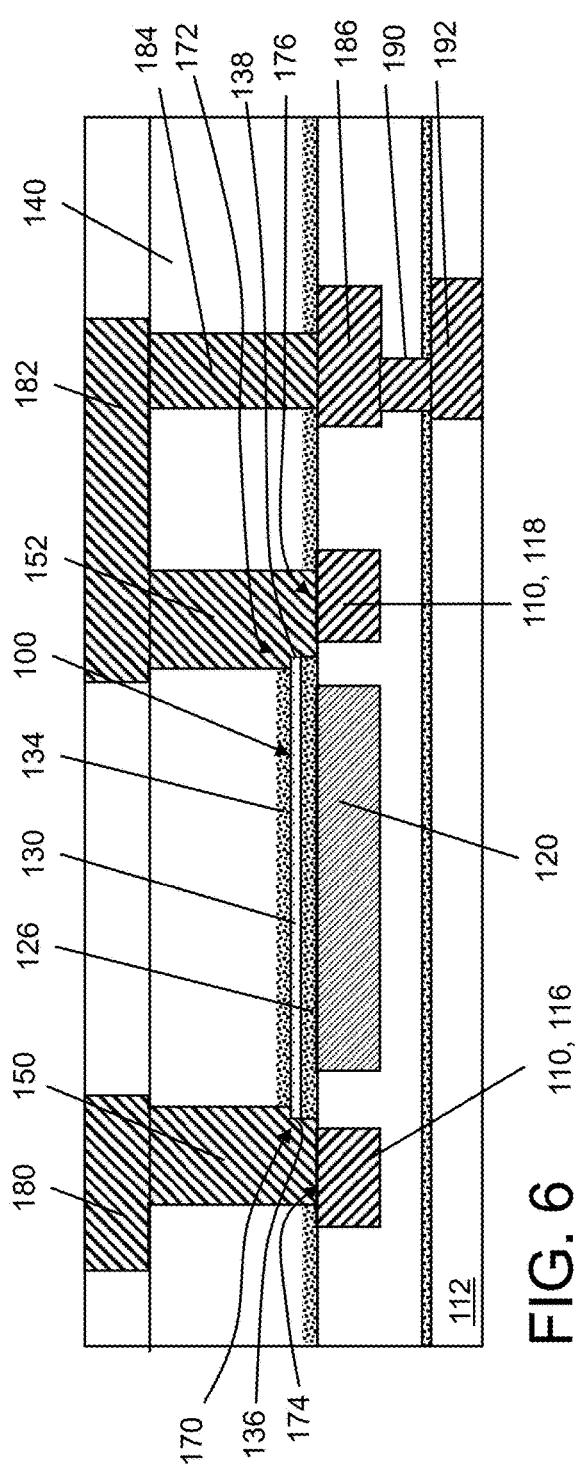
FIG. 6 shows a cross-sectional view of a thin film resistor with a viabar structure, according to other embodiments of the disclosure.

FIG. 6 shows a cross-sectional view of a TFR 100 in which the TFR includes a third viabar structure 184 adjacent to and coupled to one of viabar structure(s) 150, 152, e.g., second viabar structure 152 as shown. Third viabar structure 184 can be made in the same manner and at the same time as first and second viabar structures 150, 152, e.g., by forming another viabar structure opening (in FIG. 3). Third viabar structure 184 is coupled to an additional conductive line 186 formed in a same metal layer and at same time as conductive line(s) 110. Additional conductive line 186 may be coupled to any other interconnect layer, e.g., to contact 190 and another conductive line 192 therebelow.

Figure 7:
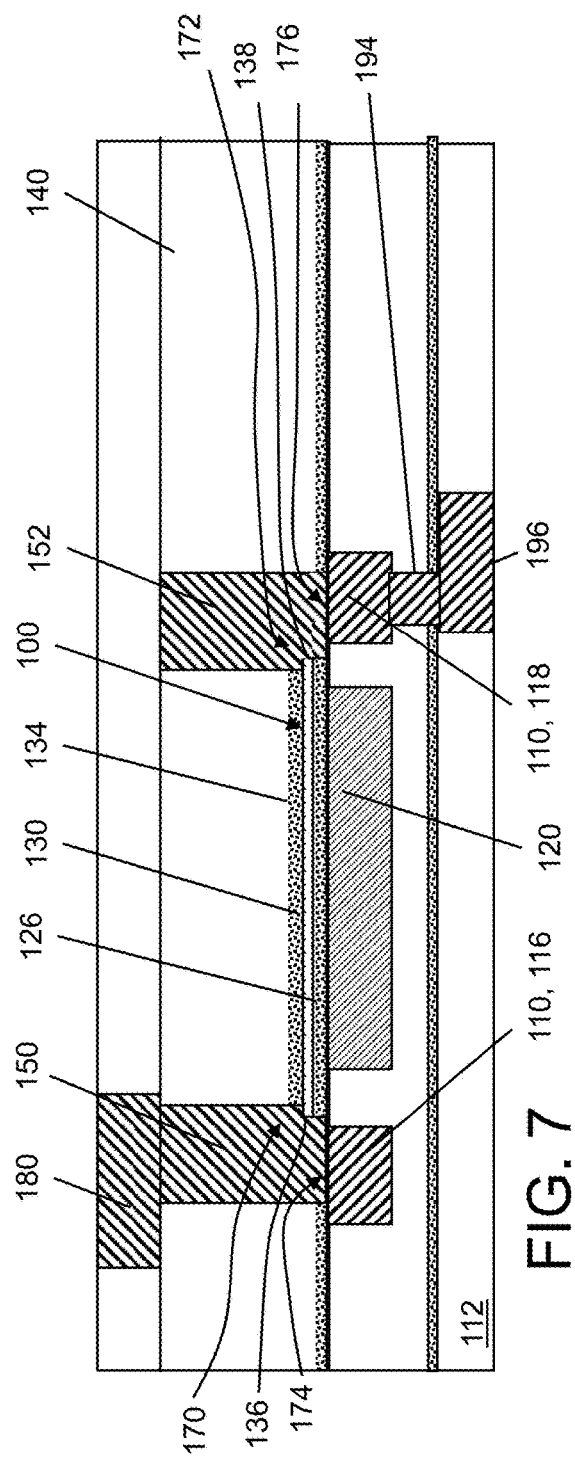
FIG. 7 shows a cross-sectional view of a thin film resistor with a viabar structure, according to yet other embodiments of the disclosure.

One advantage of using conductive line(s) 110 below TFR 100 for assistance in forming viabar structures 150 152 is that conductive line(s) 110, e.g., first conductive line 116 and/or second conductive line 118, can be used to provide alternative electrical routing to TFR 100, i.e., from below resistive layer 130. FIG. 7 shows a cross-sectional view of TFR 100 in which conductive line(s) 110 is/are coupled to a contact 194 thereunder that is coupled to another conductive line 196 under contact 194. In FIG. 7, first viabar structure 150 is electrically coupled from above, but it can also be connected as shown for conductive line 118.

Regardless of interconnect line routing, it is understood that TFR 100 is operatively coupled to other integrated circuit components (not shown), like transistors, as part of a larger circuit.

Embodiments of the disclosure provide various technical and commercial advantages, examples of which are discussed herein. The TFR with viabar structure reduces current crowding from tight contact spacing typically experienced using conventional contacts, i.e., on upper surfaces of ends of the resistive layer. The TFR also allows alternative routing of interconnects to the TFR than just from above using the conductive line(s). Advantageously, the formation of TFR does not require any additional processing changes. The viabar structures also provide low terminal resistance because they are directly on the resistive layer.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A thin-film resistor (TFR), comprising:
a first conductive line and a second conductive line;
a resistive layer over the first conductive line and the second conductive line;
a first viabar structure partially landed over the resistive layer and electrically connected to a first edge of the resistive layer and partially landed on the first conductive line; and
a second viabar structure partially landed over the resistive layer and electrically connected to a second edge opposing the first edge of the resistive layer and partially landed on the second conductive line,
wherein the second conductive line is coupled to a contact thereunder that is coupled to another conductive line under the contact.

2. The TFR of claim 1, further comprising a first etch stop layer over the first conductive line and under the resistive layer, and a second etch stop layer over the resistive layer.

3. The TFR of claim 2, wherein the first viabar structure and the second viabar structure each include a viabar portion extending through the first etch stop layer to couple to the first conductive line and the second conductive line, respectively.

4. The TFR of claim 1, further comprising a tertiary conductive line coupled to an upper end of the second viabar structure, the tertiary conductive line coupled to a third viabar structure coupled to at least an additional conductive line.

5. The TFR of claim 1, wherein the first conductive line and the second conductive line are in a first dielectric layer, and further comprising a heat sink in the first dielectric layer under the resistive layer.

6. The TFR of claim 4, wherein the additional conductive line is coupled to a contact thereunder, and the contact is coupled to the another conductive line under the contact.

7. A thin-film resistor (TFR), comprising:
a first conductive line in a first dielectric layer;
a resistive layer over the first conductive line;
at least one viabar structure coupled to the resistive layer and including a first viabar portion electrically connected to the resistive layer at a first edge thereof and a second viabar portion electrically connected to the first conductive line;
a heat sink in the first dielectric layer under the resistive layer; and
a second conductive line separate from the first conductive line, and wherein the second conductive line is coupled to the second viabar portion and is under a second edge opposing the first edge of the resistive layer.

8. The TFR of claim 7, further comprising a first etch stop layer over the first conductive line and under the resistive layer, and a second etch stop layer over the resistive layer.

9. The TFR of claim 7, further comprising a third viabar structure adjacent to and coupled to the at least one viabar structure, the third viabar structure coupled to an additional conductive line in a same metal layer as the first conductive line.

10. The TFR of claim 9, wherein the additional conductive line is coupled to a contact thereunder, and the contact is coupled to another conductive line under the contact.

11. The TFR of claim 7, wherein the first viabar portion includes a vertical sidewall of the at least one viabar structure.

12. A thin-film resistor (TFR), comprising:
a first conductive line and a second conductive line;
a resistive layer over the first conductive line and the second conductive line;
a first viabar structure partially landed over the resistive layer and electrically connected to a first edge of the resistive layer and partially landed on the first conductive line;
a second viabar structure partially landed over the resistive layer and electrically connected to a second edge opposing the first edge of the resistive layer and partially landed on the second conductive line; and
a tertiary conductive line coupled to an upper end of the second viabar structure, the tertiary conductive line coupled to a third viabar structure coupled to at least an additional conductive line in a same metal layer as the first conductive line.

13. The TFR of claim 12, wherein the additional conductive line is coupled to a contact thereunder, and the contact is coupled to another conductive line under the contact.

14. The TFR of claim 12, wherein the first conductive line and the second conductive line are in a first dielectric layer, and further comprising a heat sink in the first dielectric layer under the resistive layer.

15. The TFR of claim 12, further comprising a first etch stop layer over the first conductive line and under the resistive layer, and a second etch stop layer over the resistive layer.

16. The TFR of claim 15, wherein the first viabar structure extends through the first etch stop layer to couple to the first conductive line.

17. The TFR of claim 12, wherein the second conductive line is coupled to a contact thereunder that is coupled to another conductive line under the contact.

18. The TFR of claim 12, wherein the first viabar structure includes a vertical sidewall.

* * * * *